United States Patent
Ruelke et al.

(10) Patent No.: US 7,022,602 B2
(45) Date of Patent: Apr. 4, 2006

(54) NITROGEN-ENRICHED LOW-K BARRIER LAYER FOR A COPPER METALLIZATION LAYER

(75) Inventors: Hartmut Ruelke, Dresden (DE); Joerg Hohage, Dresden (DE); Thomas Werner, Dresden (DE); Michael Kiene, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 15 days.

(21) Appl. No.: 10/716,681

(22) Filed: Nov. 19, 2003

(65) Prior Publication Data

US 2004/0214430 A1    Oct. 28, 2004

(30) Foreign Application Priority Data

Apr. 28, 2003  (DE)  ................. 103 19 136

(51) Int. Cl.
*H01L 21/4763*  (2006.01)
*H01L 21/311*  (2006.01)

(52) U.S. Cl. ............. 438/640; 438/624; 438/701
(58) Field of Classification Search ........ 438/622–640, 438/700–703, 687, 734–738, 778–781
See application file for complete search history.

(56) References Cited

U.S. PATENT DOCUMENTS

| | | | | |
|---|---|---|---|---|
| 5,962,344 A | * | 10/1999 | Tu et al. | 438/694 |
| 6,656,837 B1 | * | 12/2003 | Xu et al. | 438/676 |
| 6,720,256 B1 | * | 4/2004 | Wu et al. | 438/638 |
| 2002/0119250 A1 | | 8/2002 | Campana et al. | 427/255.28 |
| 2003/0045098 A1 | | 3/2003 | Verhaverbeke et al. | 438/689 |
| 2003/0077916 A1 | | 4/2003 | Xu et al. | 438/778 |
| 2004/0084680 A1 | * | 5/2004 | Ruelke et al. | 257/77 |

FOREIGN PATENT DOCUMENTS

EP    1 061 156 A2    12/2000
EP    1 077 479 A1    2/2001

OTHER PUBLICATIONS

Kim et al., "Breakdown Phenomena in MIS Structure," *Proc. Of 3rd Int'l Conf. on Properties and Application of Dielectric Materials*, Tokyo, Japan, pp. 164-168, Jul. 8-12, 1991.

Shanware et al., "Reliability evaluation of HiSiON gate dielectric film with 12.8 Å $SiO_2$ equivalent thickness," *IEEE*, pp. 6.6.1-6.6.4, 2001.

Abadeer et al., "Key measurements of ultrathin gate dielectric reliability and in-line monitoring," *IBM J. Res. Develop.*, 43:407-16, 1999.

* cited by examiner

*Primary Examiner*—Thanhha Pham
(74) *Attorney, Agent, or Firm*—Williams, Morgan & Amerson, P.C.

(57) ABSTRACT

The effect of resist poisoning may be eliminated or at least substantially reduced in the formation of a low-k metallization layer, in that a nitrogen-containing barrier layer is provided with a surface modified by plasma treatment. Consequently, diffusion of nitrogen and nitrogen compounds in vias formed in the low-k dielectric layer is significantly suppressed, so that in a subsequent photolithography step interaction of nitrogen and nitrogen compounds with the photoresist is remarkably reduced.

17 Claims, 4 Drawing Sheets

NITROGEN-ENRICHED LOW-K BARRIER LAYER FOR A COPPER METALLIZATION LAYER

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material having low permittivity to enhance device performance.

2. Description of the Related Art

In modern integrated circuits, minimum feature sizes, such as the channel length of field effect transistors, have reached the deep sub-micron range, thereby steadily increasing performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip.

In integrated circuits having minimum dimensions of approximately 0.35 μm and less, a limiting factor of device performance is the signal propagation delay caused by the switching speed of the transistor elements. As the channel length of these transistor elements has now reached 0.18 μm and less, it turns out, however, that the signal propagation delay is no longer limited by the field effect transistors but is limited, owing to the increased circuit density, by the close proximity of the interconnect lines, since the line-to-line capacitance is increased in combination with a reduced conductivity of the lines due to their reduced cross-sectional area. The parasitic RC time constants, therefore, require the introduction of new types of materials for forming the metallization layer.

Traditionally, metallization layers are formed by a dielectric layer stack including, for example, silicon dioxide and/or silicon nitride, with aluminum as the typical metal. Since aluminum exhibits significant electromigration at the higher current densities that may be necessary in integrated circuits having extremely scaled feature sizes, aluminum is being replaced by copper, which has a significantly lower electrical resistance and a higher resistivity against electromigration. For devices having feature sizes of 0.13 μm and less, it turns out that simply replacing aluminum with copper does not provide the required decrease of the parasitic RC time constants, and, therefore, the well-established and well-known dielectric materials silicon dioxide (k≈4.2) and silicon nitride (k>5) are increasingly replaced by so-called low-k dielectric materials. However, the transition from the well-known and well-established aluminum/silicon dioxide metallization layer to a low-k dielectric/copper metallization layer is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene technique is frequently employed in forming metallization layers including copper lines. Typically, in the damascene technique, the dielectric layer is deposited and then patterned with trenches and vias that are subsequently filled with copper by plating methods, such as electroplating or electroless plating. Although the damascene technique is presently a well-established technique for forming copper metallization layers in standard dielectric materials, such as silicon dioxide, the employment of low-k dielectrics, however, requires the development of new dielectric diffusion barrier layers so as to avoid copper contamination of adjacent material layers, as copper readily diffuses in a plurality of dielectrics. Although silicon nitride is known as an effective copper diffusion barrier, silicon nitride may not be considered as an option in low-k dielectric layer stacks owing to its high permittivity. Therefore, presently, silicon carbide is deemed as a viable candidate for a copper diffusion barrier. It turns out, however, that copper's resistance against electromigration strongly depends on the interface between the copper and the adjacent diffusion barrier layer. Therefore, in sophisticated integrated circuits featuring high current densities, it is generally preferable to use up to 20% nitrogen in the silicon carbide layer, thereby remarkably improving the electromigration behavior of copper compared to pure silicon carbide.

A further problem in forming low-k copper metallization layers has been underestimated in the past and is now considered a major challenge in the integration of low-k dielectrics. During the patterning of the low-k dielectric material, standard photolithography is used to image the required structure into the photoresist that is sensitive in the deep UV range. In developing the photoresist, certain portions of the resist which have been exposed may not, however, be completely removed as required and thus the structure may then not be correctly transferred into the underlying low-k dielectric material during the subsequent etch process. The effect of insufficiently developing the photoresist is also referred to as resist poisoning. With reference to FIGS. 1a–1e, a typical conventional process flow will now be described to explain the problems involved in forming a metallization layer including copper and a low-k dielectric in more detail.

Figure 1A:
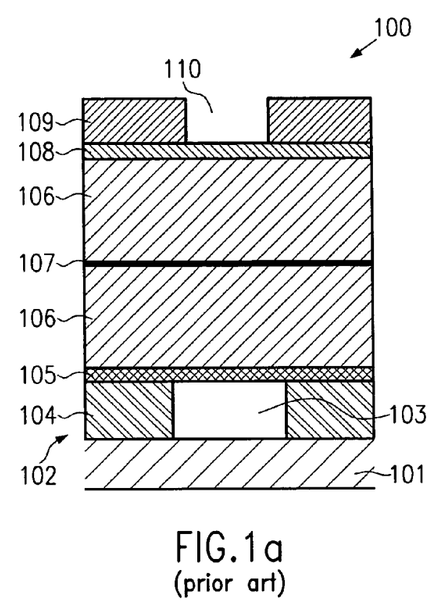
FIGS. 1a–1e schematically show cross-sectional views of a semiconductor structure including a low-k metallization layer, wherein trenches in the low-k dielectric are substantially not formed owing to resist poisoning in the dual damascene process.

FIG. 1a schematically shows a cross-sectional view of a semiconductor structure 100, in which a low-k dielectric material is to be patterned in accordance with a so-called "via first/trench last" process sequence, which is presently considered as the most promising process scheme in patterning low-k dielectrics. The semiconductor structure 100 comprises a substrate 101 that may include circuit elements, such as transistors, resistors, capacitors and the like, and which may include a lower metallization layer 102 including a metal region 103 embedded in a dielectric material 104. Depending on the level of the lower metallization layer 102, the metal region 103 may comprise copper and the dielectric 104 may be a low-k dielectric, such as hydrogen-containing silicon oxycarbide (SiCOH). A barrier layer 105 is formed of nitrogen-containing silicon carbide (SiCN) which also serves as an etch stop layer in the following etch procedure for patterning an overlying low-k dielectric layer 106. The low-k dielectric layer 106 may comprise, depending on the process sequence used, an intermediate etch stop layer 107, which in many applications may, however, be omitted for the benefit of a reduced total permittivity. The low-k dielectric material in the layer 106 may comprise SiCOH. A cap layer 108, for example comprised of oxide or provided as an anti-reflective coating (ARC), may optionally be located on the low-k dielectric layer 106 and may then serve as a stop layer in removing excess copper in a subsequent chemical mechanical polishing (CMP) process. A resist mask 109 including an opening 110 is formed above the optional cap layer 108.

A typical process flow for forming the semiconductor structure 100 as shown in FIG. 1a may comprise the following steps. After planarizing the lower metallization layer 102, the barrier/etch stop layer 105 is deposited, for example by a plasma enhanced chemical vapor deposition (PECVD) from trimethyl silane (3MS) and ammonia (NH$_3$) as precursor gases. Then, the hydrogen-containing silicon oxycarbide 104 is deposited, wherein, if required, the silicon carbide layer 107 is formed when a first adequate thickness of the dielectric layer 106 is obtained. Thereafter, the residual layer 106 is deposited to achieve the required overall thickness of the layer 106. Next, the cap layer 108, if required, is deposited with a desired thickness. The cap layer 108 may help to substantially avoid any interaction of the low-k dielectric of the layer 106 with the overlying resist mask 109 and may serve as a CMP stop layer. Then, the resist mask 109 is patterned in accordance with well-established deep UV lithography techniques to form the opening 110 determining the dimensions of the vias to be formed within the dielectric layer 106.

Figure 1B:
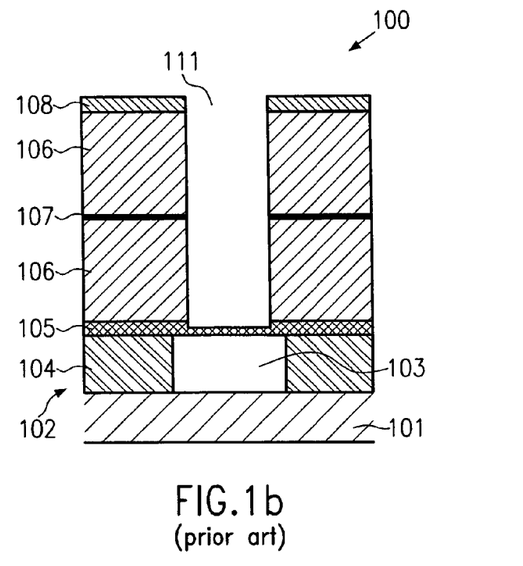

FIG. 1b schematically shows the semiconductor structure 100 after an anisotropic etch process for forming a via 111 in the cap layer 108 and the dielectric layer 106. During the anisotropic etch procedure, the barrier/etch stop layer 105 exhibits a significantly lower etch rate than the surrounding dielectric layer 106 so that the etch process may be stopped in or on the layer 105. Thereafter, the remaining photoresist not consumed during the anisotropic etch process is removed by an etch step in an oxygen-containing plasma ambient. It should be noted that, in particular, the nitrogen contained in the barrier/etch stop layer 105 may readily diffuse into the low-k dielectric of the layer 106 due to the desired porosity of this material. Since the cap layer 108 substantially prevents any diffusion from nitrogen or nitrogen-containing compounds into the overlying resist mask 109, the patterning of the opening 110 and the subsequent patterning of the via 111 is substantially not affected by any resist poisoning effects.

Figure 1C:
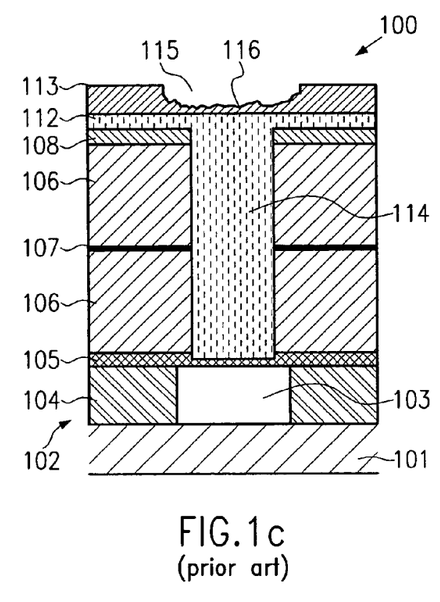

FIG. 1c schematically shows the semiconductor structure 100 in an advanced manufacturing stage. The via 111 is filled with an organic anti-reflective coating material so as to include a via plug 114, whereas the organic material is provided at the remaining surface of the structure 100 so as to form an anti-reflective coating layer 112 for the subsequent photolithography. Thus, the plug 114 and the anti-reflective coating 112 serve to planarize the topography of the semiconductor structure 100 prior to the formation of a further photoresist mask 113. As shown, the photoresist mask 113 includes a trench opening 115 at the bottom of which resist residuals 116 are maintained.

The via plug 114 and the anti-reflective coating 112 may be formed by spin-on techniques and the like, and the photoresist mask 113 may be formed by sophisticated lithography methods, as are well known in the art. Contrary to the formation of the resist mask 109, nitrogen or nitrogen compounds that may originate from the layer 105 may readily diffuse in the organic anti-reflective coating material and may now come into contact with the overlying photoresist 113, since the protecting cap layer 108 is open at the via 111. The interaction of nitrogen and compounds thereof with the photoresist may deteriorate the light sensitivity of the resist. Consequently, upon exposure and development of the photoresist 113 in forming the trench opening 115, the resist residuals 116 remain and significantly affect the following anisotropic etch step for forming a trench in the upper portion of the dielectric layer 106.

Figure 1D:
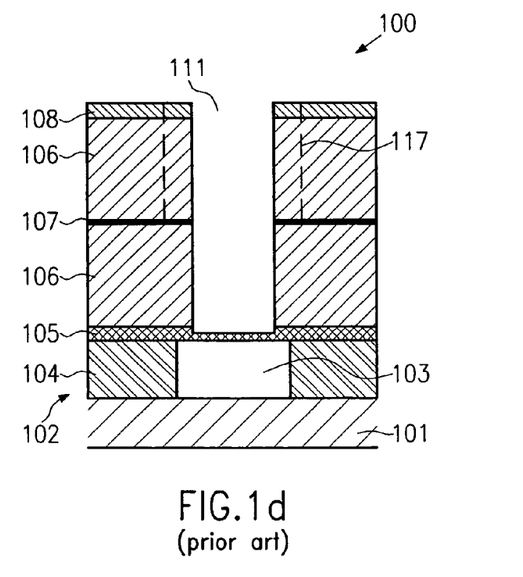

FIG. 1d schematically shows the semiconductor structure 100 after completion of the trench forming step. As is evident from FIG. 1d, the trench 117 that should have been formed in the dielectric layer 106 is substantially not transferred from the photoresist mask 113 to the underlying cap layer 108 and the upper portion of the dielectric layer 106. Thus, after removing the remaining photoresist mask 113, the cap layer 108 and the dielectric layer 106 comprise substantially the via 111 without any trench in the upper portion of the layer 106. Even a significant increase in the thickness of the anti-reflective coating 112 may not efficiently prevent the overlying photoresist layer 113 from interacting with up-diffusing nitrogen-containing compounds.

Figure 1E:
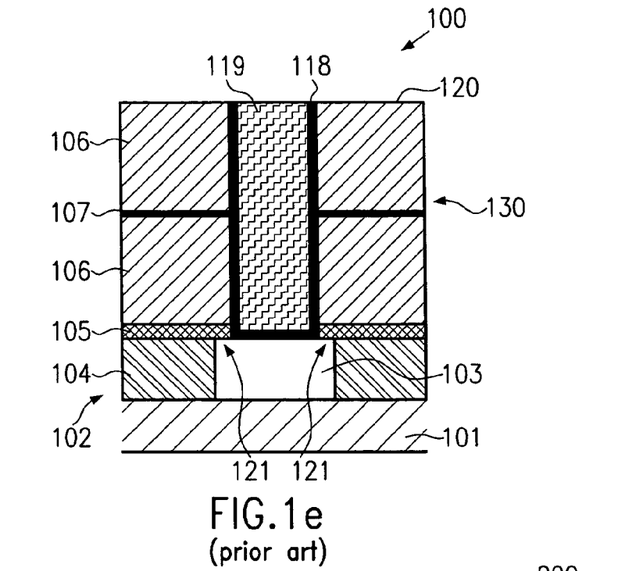

FIG. 1e schematically shows the semiconductor structure 100 after completion of the metallization layer 130, including a barrier metal layer 118 on inner sidewalls and the bottom of the via 111, which is filled with copper 119. Moreover, a surface 120 of the metallization layer 130 is planarized to allow the formation of a further metallization layer.

Typically, the barrier metal layer 118 may be deposited by physical vapor deposition, such as sputter deposition, with a thickness that insures sufficient protection against copper out-diffusion and at the same time provides a required adhesion to the surrounding low-k dielectric material. For example, tantalum and/or tantalum nitride may be used as the material for the barrier metal layer 118. Subsequently, a copper seed layer is deposited to promote the subsequent deposition of the bulk copper by electroplating. Then, the excess copper is removed by chemical mechanical polishing, wherein the cap layer 108 is also removed, and acts as a stop layer, to reliably control the CMP process. However, since the trenches 117 required for the electrical connection are missing, as shown in FIGS. 1d–1e, or are at least substantially reduced in size, device failures occur, or at least a significantly reduced device reliability is caused. Moreover, as electromigration of copper strongly depends on the characteristics of the interface to the surrounding material, it is important to maintain a required nitrogen concentration within the layer 105, especially at regions 121, in which the copper of the metal region 103 is in contact with the barrier/etch stop layer 105, so as to obtain the required electromigration behavior, an improved adhesion and the like, compared to pure silicon carbide layers.

In view of the above problems, it is thus highly desirable to provide a technique that provides superior barrier characteristics without unduly promoting resist poisoning in the formation of low-k metallization layers.

SUMMARY OF THE INVENTION

Generally, the present invention is directed to a method and a device to provide the required nitrogen concentration in a dielectric barrier/etch stop layer that may comprise silicon carbide, wherein a surface of the layer is modified by plasma treatment so as to significantly reduce the nitrogen migration therethrough while maintaining the desired barrier characteristics.

According to one illustrative embodiment of the present invention, a method comprises forming a nitrogen-enriched silicon carbide-containing layer over a substrate. Moreover, at least a surface of the nitrogen-enriched silicon carbide-containing layer is modified by treating the same with an inert plasma atmosphere.

According to another illustrative embodiment of the present invention, a method of forming a metallization layer comprises depositing a nitrogen-containing low-k barrier layer over a substrate and modifying a surface of the nitrogen-containing low-k barrier layer by a plasma treatment. Then, a low-k dielectric layer is deposited over the low-k barrier layer and the low-k dielectric layer is patterned by a lithography process, wherein the modified surface reduces resist poisoning during the lithography process. Finally, a metal region is formed in the patterned low-k dielectric layer.

According to still another illustrative embodiment of the present invention, a semiconductor device comprises a substrate and a metallization layer formed above the substrate. The metallization layer includes a dielectric barrier layer comprising silicon carbide and nitrogen, wherein the dielectric barrier layer has a first surface and a second surface. A noble gas atom concentration at the first surface is higher than at the second surface. The metallization layer further includes a low-k dielectric layer having formed therein a metal region, wherein the first surface is in contact with the low-k dielectric layer.

According to still a further embodiment of the present invention, a method comprises forming a barrier layer comprised of a nitrogen-enriched silicon carbide-containing layer over a substrate. A first surface of the barrier layer is exposed to a plasma ambient comprising a noble gas to thereby increase a concentration of atoms of the noble gas in a first region of the barrier layer having a first depth. Then, at least one dielectric layer is formed above the barrier layer after the first surface of the barrier layer is exposed to the plasma ambient and a conductive interconnection is formed in the dielectric layer.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on investigations that have been performed in order to clarify the reasons for resist poisoning in a typical dual damascene process sequence. It is believed that a reaction of amine species, that is, nitrogen hydrogen compounds (N—H*), created by diffusion of nitrogen into the overlying low-k dielectric interact with the low-k dielectric and, upon up-diffusion, with the photoresist. The interaction of the nitrogen-containing compounds with the photoresist may then lead to undeveloped resist residuals in the trench resist mask in a via first/trench last process. According to the present invention, the nitrogen contained in the barrier/etch stop layer (for convenience the term "barrier layer" will be used hereinafter) or in any other material regions provided below the barrier layer is substantially confined by modifying the surface of the barrier layer, thereby maintaining the superior barrier and adhesion characteristics to an underlying metal. The surface modification may be accomplished by a plasma treatment after the deposition of the barrier layer, wherein an in situ deposition and plasma treatment scheme may be advantageous in view of tool utilization and throughput. The term in situ is to be understood as a process sequence requiring the establishment of one or more atmospheres in a vacuum, that is, negative pressure, ambient, wherein the vacuum is substantially maintained during each process of the sequence, or in other words, wherein the substrate is not exposed to the ambient atmosphere prevailing outside of a process tool or process chamber.

Figure 2A:
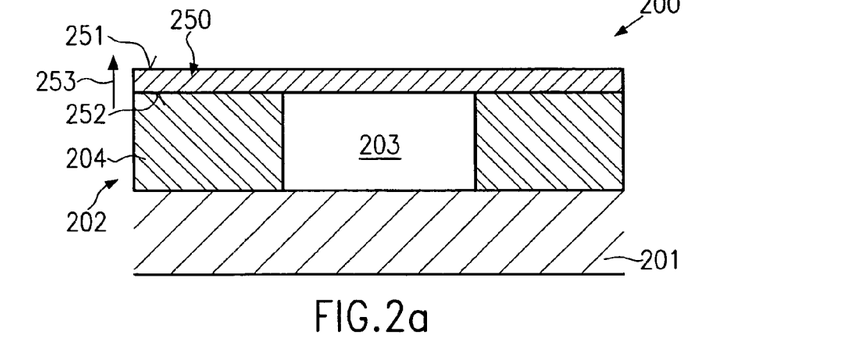
FIGS. 2a–2g schematically show cross-sectional views of a semiconductor structure during various stages in manufacturing a low-k metallization layer with reduced resist poisoning according to illustrative embodiments of the present invention.

With reference to FIGS. 2a–2g, further illustrative embodiments of the present invention will now be described. In FIG. 2a, a semiconductor structure 200 comprises a substrate 201 over which a first metallization layer 202 is formed. As already explained with reference to FIGS.

1a–1e, the substrate 201 may include any circuit elements, such as transistors, resistors, capacitors and the like, wherein the first metallization layer 202 provides electrical contact to at least some of the circuit elements. The first metallization layer 202 may represent the very first metallization layer or may represent any intermediate metallization layer over which one or more additional metallization layers are to be formed. The first metallization layer 202 may include a first dielectric layer 204 with a first metal region 203 contained therein. In the present example, the first metal region 203 may be comprised of copper including a barrier diffusion layer (not shown) provided between the dielectric material 204 and the copper of the first metal region 203. A barrier layer 250 is formed over the first metallization layer 202 and has a first surface 251 and a second surface 252 in contact with the first metallization layer 202. In one particular embodiment, the barrier layer 250 is comprised of silicon carbide that contains an enhanced concentration of nitrogen for the required barrier and adhesion characteristics. For example, the nitrogen concentration may be in the range of approximately 20–30 weight percent. A surface region including the surface 251 of the barrier layer 250 has a modified structure compared to lower lying portions of the barrier layer 250. For instance, the surface 251 and portions up to a depth of about 2–30 Å may have an increased density compared to the residual barrier layer 250, wherein additional inert atoms, such as argon, krypton or other noble gas atoms, are incorporated into the barrier layer 250. In one particular embodiment, helium atoms may be present in the barrier layer 250 in addition to silicon, carbon and nitrogen. In this respect, it is to be noted that other impurities may be present in the barrier layer 250 depending on the "process history" for forming the barrier layer 250. However, these impurities are incorporated in a significant lesser amount than silicon, carbon, nitrogen and the inert component, such as helium. Although some of these impurities may also contribute to resist poisoning in a conventional structure, such as the one described with reference to FIGS. 1a–1e, the modified surface 251 significantly reduces the diffusion activity of these impurities and also the diffusion of nitrogen, thereby effectively decreasing the amount of nitrogen compounds that may diffuse from the barrier layer 250 and lead to resist poisoning in further manufacturing processes, as will be described later.

A typical process flow for manufacturing the semiconductor structure 200, as shown in FIG. 2a, may include the following steps. First, the substrate 201 may be provided having already formed thereon the first metallization layer 202. The formation of the first metallization layer 202 may comprise substantially the same steps as used for the formation of a subsequent metallization layer as will be described in more detail later in this application and thus description thereof will be omitted here. Thereafter, the barrier layer 250 is deposited by, for example, plasma enhanced CVD with a required thickness, for example, in the range of approximately 10–100 nm. During deposition, the amount of a nitrogen-containing precursor gas may be controlled so as to obtain a nitrogen concentration in the deposition ambient and thus in the deposited layer 250 as is required for the desired barrier and adhesion characteristics.

In one embodiment, precursor gases 3MS (trimethyl silane) and ammonia ($NH_3$), 4MS (tetramethyl silane), liquid precursors, such as TOMCAT™, OMCTS, and the like, are used in combination with an inert gas, such as helium, to establish a reactive ambient for the deposition of a nitrogen-containing silicon carbide layer. The ratio between 3MS and ammonia ($NH_3$) substantially determines the amount of nitrogen incorporated into the silicon carbide layer 250. The deposition may take place in any appropriate CVD process tool (not shown), which additionally allows the establishment of a plasma ambient. For example, plasma enhanced CVD deposition systems available from Applied Materials such as DXZ™ or Producer™ may be used. For the above specified deposition tool, typical process parameters may be as follows:

Gas flows: 3MS: about 100–200, for example 160, sccm;
Ammonia ($NH_3$): about 200–500, for example 325, sccm;
He: about 350–450, for example 400, sccm;
HF power: about 200–400, for example 300, Watt;
Pressure: about 2–4, for example 3, Torr;
Substrate temperature: about 300–400° C., for example 335° C.

For the above specified parameters and a deposition time of about 15–20 seconds, a thickness of the barrier layer may be obtained in the range of approximately 20–70 nm. The nitrogen concentration of the barrier layer may range from approximately 20–30 weight percent. The above parameter ranges, as well as the specified precursor and carrier gases, may provide sufficient guidance for the skilled person so as to readily adapt the process to the actually used deposition tool and deposition scheme.

Figure 2B:
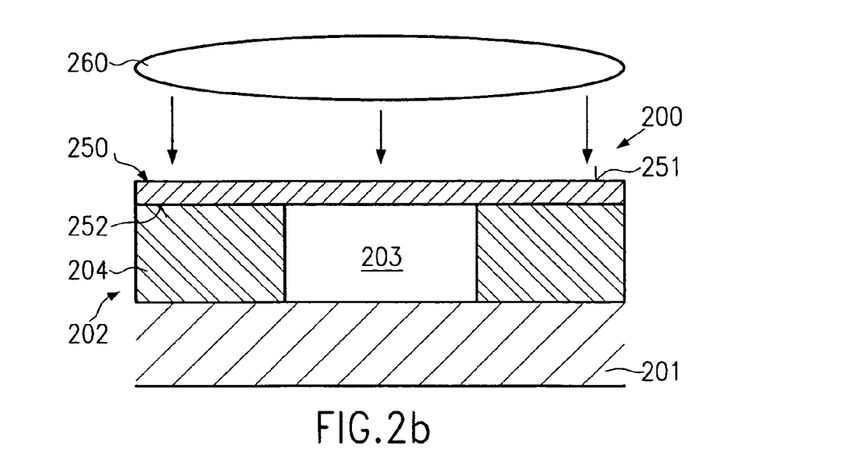

In FIG. 2b, the semiconductor structure 200 is depicted after the deposition of the barrier layer 250, when exposed to a plasma atmosphere 260 for modifying the surface 251. In one particular embodiment, the plasma atmosphere 260 may be established from a noble gas, e.g., a helium gas atmosphere. The helium plasma atmosphere 260 enables the modification of the structure of the surface 251 and a region adjacent the surface 251 without substantially deteriorating the characteristics of the remaining portion of the barrier layer 250 due to the light atomic weight of the helium particles. Thus, a region of only a few Angstrom (e.g., 3–30 Å) thickness below the surface 251 may be affected by the plasma atmosphere 260, while nevertheless effectively densifying the surface 251, thereby significantly reducing nitrogen migration therethrough. That is, by exposing the surface 251 of the barrier layer 250 to the plasma ambient, the concentration of helium atoms (or other noble gas atoms) is increased relative to the concentration of such noble gas atoms in the remainder of the barrier layer 250. The depth of the region exhibiting an increased concentration of noble gas atoms may vary depending on the particular application. In one illustrative embodiment, the depth of such a region may be approximately 0.3–3 nm In other embodiments, heavier inert particles, such as argon particles, may be used in establishing the plasma atmosphere 260, when a more significant impact on portions located more deeply is tolerable.

In one particular embodiment, the deposition of the barrier layer 250 and the treatment with the plasma atmosphere 260 are performed as an in situ sequence, thereby optimizing tool utilization and throughput. For instance, the above-identified deposition tools or any other appropriate deposition tool may be used with process parameters for the plasma atmosphere 260 as follows:

Gas flow: He: about 1500–4000, for example 2600, sccm;
HF power: about 200–500, for example 350, Watt;
Pressure: about 7.0–10, for example 8.7, Torr;
Substrate temperature: about 300–400° C., for example 335° C.

A time interval for the plasma treatment may range from approximately 10–60 seconds.

It may be appreciated that the process parameters of the plasma atmosphere 260 may mutually depend from each other as well as on the specifics of the process chamber of the deposition tool, such as the geometry of the chamber, the configuration and equipment of the process chamber, and the like. Starting with the above-specified values, however, a suitable set of parameter values may be obtained for any type of deposition tool by experiment.

In one embodiment, the plasma treatment may be preceded by a purge step so as to remove precursor gases and/or reaction byproducts created during the deposition of the barrier layer 250. To this end, the supply of the precursors, such as 3MS and ammonia ($NH_3$), may be discontinued and a purge gas may be fed to the process chamber. In one embodiment, the purge gas may be the same as is used in establishing the plasma atmosphere 260. Typically, the duration of the purge step may range from about 3–10 seconds. However, in some cases, it may be considered appropriate to prolong the purge step beyond the above specified time intervals to minimize traces of impurities, whereas, in other cases, the purge step may be omitted or may be combined with a stabilizing step for establishing a gaseous atmosphere prior to igniting a plasma. For instance, a gaseous atmosphere including a gas as is used for the plasma atmosphere 260, such as helium, may be generated for an appropriate time period with a pressure that is suitable for creating the plasma atmosphere 260, wherein a part of the stabilizing step may be used to remove undesired contaminants, such as nitrogen. Typically, the stabilizing step may range from about 5–15 seconds, for example about 12 seconds.

In other embodiments, heavier inert atoms may be used in establishing the plasma atmosphere 260, when the impact of the heavier particles on the barrier layer 250 may be tolerable. For instance, argon, krypton or other noble gases may be used to modify the surface 251 by releasing among others nitrogen and/or by incorporating these heavier particles into the barrier layer 250, thereby reducing the release and thus the diffusion of nitrogen in subsequent processes as will be described in more detail below.

Figure 2C:
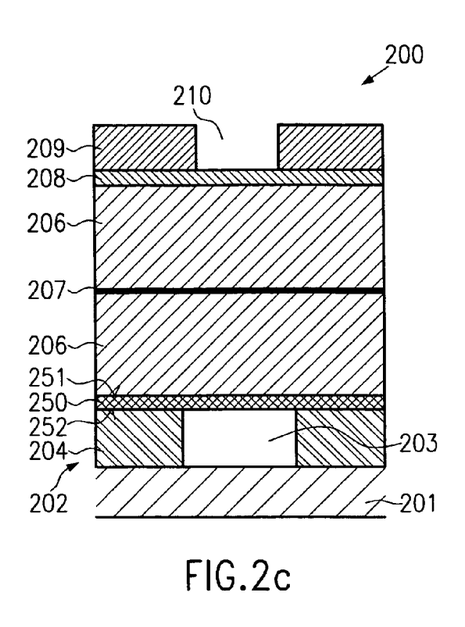

FIG. 2c schematically shows the semiconductor structure 200 in an advanced manufacturing stage similar to that shown in FIG. 1a. Thus, the semiconductor structure 200 comprises a low-k dielectric layer 206 that may be comprised of a first layer and a second layer with an etch stop layer 207, for example formed of silicon carbide, interposed therebetween, whereas, in other embodiments, the etch stop layer 207 is omitted. The low-k dielectric layer 206 is comprised of any appropriate dielectric material, such as silicon oxycarbide (SiCOH) and the like. A cap layer 208 may optionally be formed over the dielectric layer 206 and a resist mask 209 having formed therein an opening 210 is formed over the cap layer 208.

Regarding the formation of the semiconductor structure 200 as shown in FIG. 2c, the same processes may be employed as previously explained with reference to FIG. 1a. It should be noted, however, that due to the reduced release and inter-diffusion of nitrogen and compounds thereof at the modified surface 251, the diffusion of nitrogen into the overlying low-k dielectric is significantly lower than in the corresponding prior art process flow. Thus, the dielectric layer 206 comprises only a minimum amount of nitrogen and nitrogen compounds. As a consequence, even in the absence of the cap layer 208, resist poisoning of the resist mask 209 is significantly reduced.

Figure 2D:
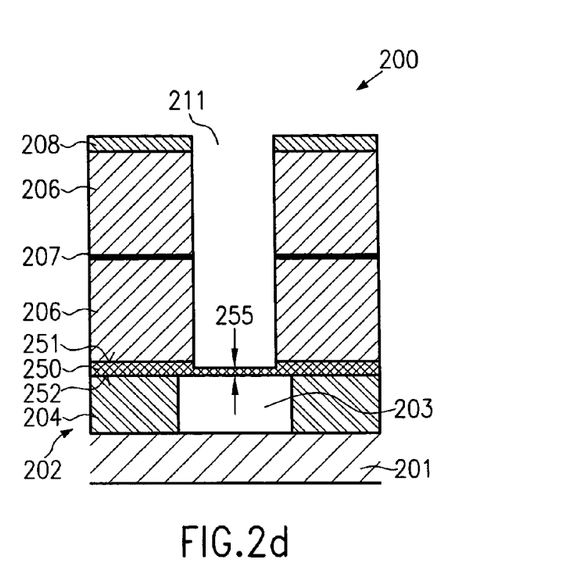

FIG. 2d shows the semiconductor structure 200 after the anisotropic etch procedure for forming a via 211 in the (optional) cap layer 208, the dielectric layer 206, the optional etch stop layer 207 and partially in the barrier layer 250 acting as an etch stop layer, thereby leaving a thickness 255 after the etch process. In one embodiment, the modification of the surface 251 may substantially reach down to the remaining portion of the barrier layer 250 having the thickness 255. In this way, liberation of nitrogen during the etch process or in a subsequent fill process is suppressed. A corresponding "depth" of the modified portion may be accomplished by appropriately adjusting the conditions during the treatment with the plasma atmosphere 260. For instance, the treatment time and/or the substrate temperature and/or the pressure and/or the type of plasma particles may be correspondingly selected so as to achieve the desired depth in modifying the surface 251.

In other embodiments, after etching the via 211, a subsequent step for out-gassing contaminants from exposed portions of the barrier layer 250 may be performed, possibly at an elevated temperature, to remove the contaminants prior to the following lithography processes. During the out-gassing, the modified surface 251 restricts the diffusion of nitrogen and nitrogen compounds of non-exposed portions of the barrier layer 250. Thus, even for a modification that is substantially restricted to the surface 251 of the barrier layer 250, nitrogen contamination in subsequent process steps may be minimized.

Figure 2E:
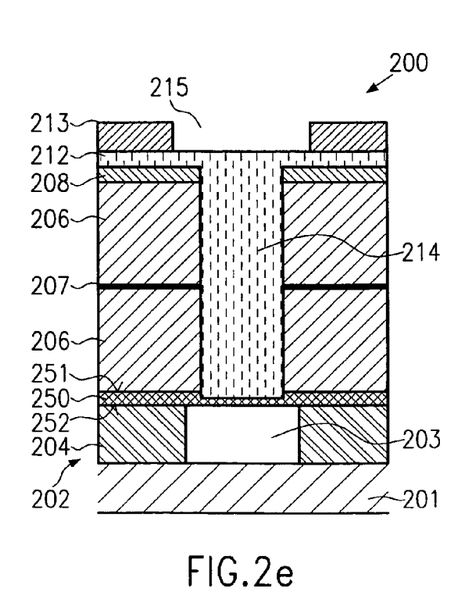

FIG. 2e schematically depicts an advanced manufacturing stage, wherein the via 211 is filled with an organic anti-reflective coating material 214 to form a via plug and a corresponding anti-reflective layer 212 is formed on the dielectric layer 206. A photoresist mask 213 having a trench opening 215 is formed over the anti-reflective layer 212.

In forming the opening 215 in the patterned photoresist mask 213 as shown in FIG. 2e, wherein substantially the same process steps may be involved as already described with reference to FIG. 1c, the amounts of nitrogen and nitrogen compounds from the barrier layer 250 diffusing up to the dielectric layer 206 in previous process steps and finally reaching the photoresist mask 213 may be reduced such that resist poisoning is reduced or eliminated. Therefore, the trench opening 215 is substantially completely open and includes only an insignificant amount of resist residuals or is even substantially free of resist residuals.

In other embodiments, the amount of resist residuals may be determined by, for example, optical measurements, the results of which may then be used to assess an "appropriateness" of the resist mask 213 for further processing. On the basis of the appropriateness, the substrate 201 may then be rejected or released. A rejection of the substrate 201 may result in a further out-gassing step as described above, wherein the resist mask 213 may be removed prior to or after the out-gassing. In one illustrative embodiment, the measurement results may be used to readjust one or more process parameters, such as process time for the plasma treatment with the plasma atmosphere 260 and/or for the out-gassing step as described above, to maintain the amount of resist residuals within a specified range.

Figure 2F:
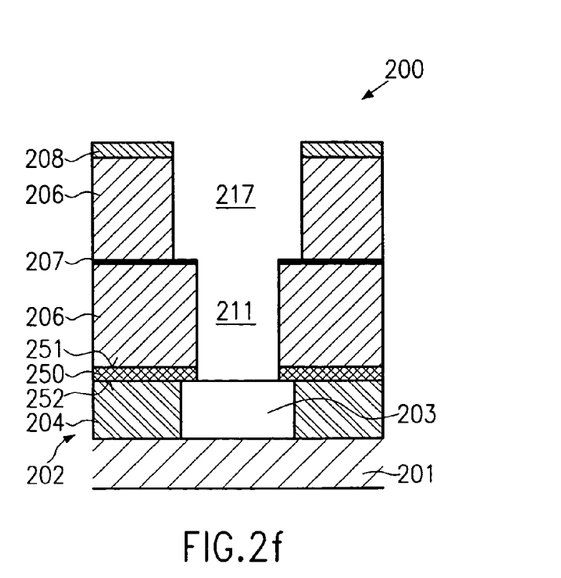

FIG. 2f shows the semiconductor structure 200 after anisotropically etching the upper portion of the dielectric layer 206 to form a trench 217 that substantially corresponds to the dimensions of the trench opening 215 in the photoresist mask 213. Etching the trench 217 and subsequently removing the anti-reflective coating 212 and the residual photoresist 213 may be carried out as already described with reference to FIG. 1d. Moreover, the barrier layer 250 may be completely opened to provide a connection to the underlying metal region 203.

Figure 2G:
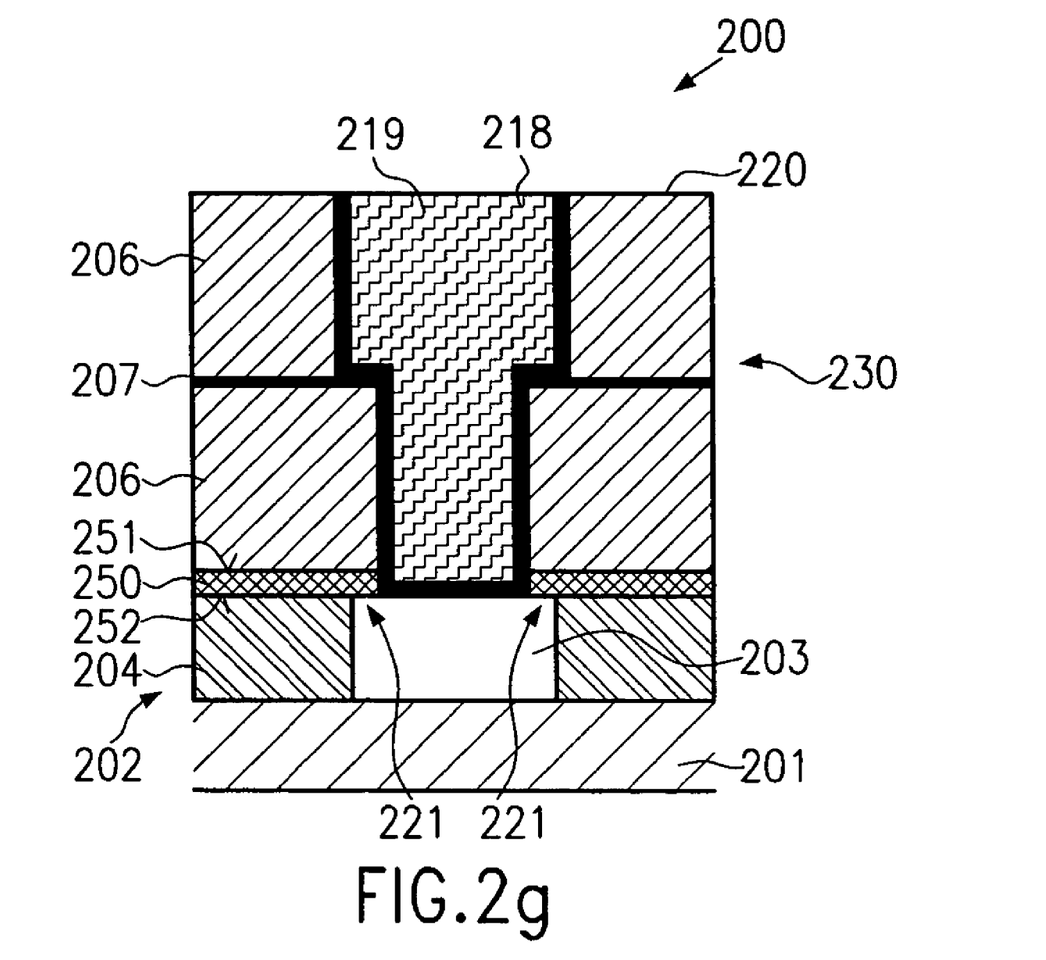

FIG. 2g schematically shows the semiconductor structure 200 with a second metallization layer 230 formed over the first metallization layer 202 and partially separated therefrom by the barrier layer 250. Moreover, a barrier metal layer 218 is formed inside the trench opening 217 and the via opening 211, wherein these openings are now filled with copper 219 so that an electrical connection is provided between the first metal region 203 and the trench 217. Moreover, the cap layer 208 is removed so that a substantially planar surface 220 is provided that may receive a further metallization layer, such as the second metallization layer 230.

Regarding the formation of the structure as shown in FIG. 2g, the same criteria apply as already pointed out with reference to FIG. 1d. In particular, interface portions 221 of the barrier layer 250 that are in contact with the first metal region 203 exhibit a sufficiently high nitrogen concentration to provide the required electromigration and adhesion characteristics, whereas, at the opposing modified surface 251, the adhesion to the dielectric layer 206 is substantially not negatively affected. This is accomplished by modifying the barrier layer 250 with a plasma treatment after deposition, resulting in an increased noble gas atom concentration at the surface 251 compared to the surface 252 that is in contact with the metallization layer 202.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a nitrogen-enriched silicon carbide-containing layer over a substrate;
   modifying at least an exposed surface of said nitrogen-enriched silicon carbide containing layer by treating the exposed surface with an inert plasma atmosphere;
   forming a low-k dielectric layer over said nitrogen-enriched silicon carbide-containing layer;
   performing a patterning process to form a via in said low-k dielectric layer by means of a first resist mask;
   after forming said via, performing an out-gassing step to remove contaminants from said nitrogen-enriched silicon carbide-containing layer; and
   after performing said out-gassing step, performing a patterning process to form a trench in said low-k dielectric layer by means of a second resist mask.

2. The method of claim 1, wherein said plasma atmosphere is established without interrupting a vacuum condition generated during the formation of said nitrogen-enriched silicon carbide-containing layer.

3. The method of claim 1, wherein said inert plasma atmosphere is substantially established from helium.

4. The method of claim 1, wherein said nitrogen-enriched silicon carbide-containing layer is formed by plasma enhanced vapor deposition.

5. The method of claim 1, further comprising, prior to modifying the surface, purging said substrate with a gas used to establish said plasma atmosphere.

6. The method of claim 5, further comprising, prior to modifying the surface, establishing a stabilized gaseous atmosphere including a gas used to subsequently establish said plasma atmosphere.

7. A method of forming a metallization layer, the method comprising:
   depositing a nitrogen-containing low-k barrier layer over a substrate;
   modifying a surface of said nitrogen-containing low-k barrier layer by introducing noble gas atoms into a region of said nitrogen-containing low-k barrier layer by exposing said nitrogen containing low-k barrier layer to a plasma treatment comprising a noble gas;
   depositing a low-k dielectric layer over said nitrogen-containing low-k barrier layer;
   patterning said low-k dielectric layer by a lithography process, wherein said modified surface reduces resist poisoning in said lithography process, wherein patterning said low-k dielectric layer includes forming a via in said low-k dielectric layer by means of a first resist mask;
   after forming said via, performing an out-gassing step to remove contaminants from said nitrogen-containing low-k barrier layer;
   after performing said out-gassing step, forming a trench in an upper portion of said low-k dielectric layer by means of a second resist mask; and
   forming a metal region in said via and said trench in said patterned low-k dielectric layer.

8. The method of claim 7, wherein said nitrogen-containing low-k barrier layer comprises silicon carbide.

9. The method of claim 7, wherein depositing said nitrogen-containing low-k barrier layer and modifying a surface thereof is performed without exposing said substrate to an ambient atmosphere.

10. The method of claim 7, wherein said plasma treatment includes establishing a plasma atmosphere on the basis of a noble gas.

11. The method of claim 10, further comprising stabilizing a gas atmosphere including helium prior to establishing said plasma atmosphere.

12. The method of claim 10, further comprising purging said substrate with a noble gas prior to establishing said plasma atmosphere.

13. The method of claim 7, further comprising determining a degree of said resist poisoning.

14. The method of claim 13, further comprising controlling, on the basis of said determined degree, at least one process parameter for said plasma treatment.

15. A method, comprising:
   forming a barrier layer comprised of a nitrogen-enriched silicon carbide-containing layer over a substrate
   exposing a surface of said barrier layer to a plasma ambient comprising a noble gas to thereby increase a concentration of atoms of said noble gas in a region of said barrier layer having a depth, wherein said depth ranges from approximately 0.3–3 nm;
   forming at least one low-k dielectric layer above said barrier layer after said surface of said barrier layer is exposed to said plasma ambient;
   patterning said at least one low-k dielectric layer by a lithography process, wherein said exposed surface reduces resist poisoning in said lithography process, wherein patterning said at least one low-k dielectric layer includes:

forming a via in said at least one low-k dielectric layer by means of a first resist mask;

after forming said via, performing an out-gassing step to remove contaminants from said nitrogen-enriched silicon carbide-containing barrier; and after performing said out-gassing step, forming a trench in an upper portion of said at least one low-k dielectric layer by means of a second resist mask; and forming a conductive interconnection in said at least one low-k dielectric layer.

16. The method of claim 15, wherein said nitrogen-enriched silicon carbide containing layer is comprised of approximately 10–30 weight percent nitrogen.

17. The method of claim 15, wherein said noble gas is comprised of at least one of helium, argon and krypton.

* * * * *

UNITED STATES PATENT AND TRADEMARK OFFICE
CERTIFICATE OF CORRECTION

PATENT NO. : 7,022,602 B2
DATED : April 4, 2006
INVENTOR(S) : Hartmut Ruelke et al.

It is certified that error appears in the above-identified patent and that said Letters Patent is hereby corrected as shown below:

Column 11,
Lines 52, 63 and 67, before "plasma" insert -- inert --.

Column 12,
Line 33, change "is performed" to -- are performed --.
Line 53, insert a semicolon -- ; -- after "substrate".

Column 13,
Line 5, after "barrier" insert -- layer --.

Signed and Sealed this

Sixth Day of June, 2006

JON W. DUDAS
*Director of the United States Patent and Trademark Office*